(12) United States Patent
Chen

(10) Patent No.: US 11,424,730 B2
(45) Date of Patent: *Aug. 23, 2022

(54) METHOD FOR PROCESSING A LITHIUM TANTALATE CRYSTAL SUBSTRATE

(71) Applicant: Fujian Jing'An Optoelectronics Co., Ltd., Quanzhou (CN)

(72) Inventor: Mingxin Chen, Quanzhou (CN)

(73) Assignee: Fujian Jing'An Optoelectronics Co., Ltd., Quanzhou (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/099,535

(22) Filed: Nov. 16, 2020

(65) Prior Publication Data

US 2021/0075395 A1 Mar. 11, 2021

Related U.S. Application Data

(63) Continuation-in-part of application No. 16/452,037, filed on Jun. 25, 2019, now Pat. No. 10,862,447.

(Continued)

(30) Foreign Application Priority Data

Dec. 26, 2016 (CN) .......................... 201611213934.9

(51) Int. Cl.
*H03H 9/02* (2006.01)
*H03H 3/08* (2006.01)
(Continued)

(52) U.S. Cl.
CPC ....... *H03H 9/02622* (2013.01); *H01L 41/332* (2013.01); *H01L 41/337* (2013.01);
(Continued)

(58) Field of Classification Search
CPC ........ H03H 3/08; H03H 9/64; H03H 9/02622; H03H 9/02559; H01L 41/1873; H01L 41/08; C30B 33/00; C30B 29/30
(Continued)

(56) References Cited

U.S. PATENT DOCUMENTS 10,862,447 B2 * 12/2020 Chen ...................... C30B 29/30
2005/0145165 A1 7/2005 Kajigaya et al.
(Continued)

FOREIGN PATENT DOCUMENTS

CN 1621578 A 6/2005
CN 1754014 A 3/2006
(Continued)

OTHER PUBLICATIONS

World Intellectual Property Organization, "Search Report" and English-translation thereof issued in international application No. PCT/CN2017/097847 by the CNIPA dated Oct. 24, 2017, document of 4 pages.

*Primary Examiner* — Duy Vu N Deo
(74) *Attorney, Agent, or Firm* — Akerman LLP; Peter A. Chiabotti

(57) ABSTRACT

A method for processing a lithium tantalate crystal substrate includes providing a lithium tantalate crystal substrate, roughening the lithium tantalate crystal substrate, providing a catalytic agent, bringing the lithium tantalate crystal substrate and the catalytic agent into contact with each other after the lithium tantalate crystal substrate is roughened, and subjecting the lithium tantalate crystal substrate to a reduction treatment. The reduction treatment is conducted at a temperature not higher than a Curie temperature of the lithium tantalate crystal substrate. The catalytic agent is selected from the group consisting of metal powder, metal gas, and metal carbonate powder.

17 Claims, 4 Drawing Sheets

Related U.S. Application Data which is a continuation-in-part of application No. PCT/CN2017/097847, filed on Aug. 17, 2017.

(51) Int. Cl.
*H03H 9/64* (2006.01)
*H01L 41/337* (2013.01)
*H01L 41/332* (2013.01)

(52) U.S. Cl.
CPC .......... *H03H 3/08* (2013.01); *H03H 9/02559* (2013.01); *H03H 9/64* (2013.01)

(58) Field of Classification Search
USPC ........................................................ 216/101
See application file for complete search history.

(56) References Cited

U.S. PATENT DOCUMENTS

| | | | |
|---|---|---|---|
| 2006/0169196 A1* | 8/2006 | Shiono | C30B 29/30 117/2 |
| 2007/0122337 A1 | 5/2007 | Kajigaya et al. | |
| 2008/0317663 A1* | 12/2008 | Kajigaya | C30B 29/30 423/594.8 |

FOREIGN PATENT DOCUMENTS

| | | | |
|---|---|---|---|
| CN | 1856597 | A | 11/2006 |
| CN | 105463581 | A | 4/2016 |
| CN | 106283196 | A | 1/2017 |
| CN | 106521633 | A | 3/2017 |
| WO | 2004030047 | A1 | 4/2004 |

\* cited by examiner

METHOD FOR PROCESSING A LITHIUM TANTALATE CRYSTAL SUBSTRATE

CROSS-REFERENCE TO RELATED APPLICATION

This application is a continuation-in-part application of U.S. patent application Ser. No. 16/452,037 filed on Jun. 25, 2019, which is a bypass continuation-in-part application of International Application No. PCT/CN2017/097847 filed on Aug. 17, 2017, which claims priority of Chinese Patent Application No. 201611213934.9, filed on Dec. 26, 2016. The entire content of each of the aforementioned applications is incorporated herein by reference.

FIELD

The disclosure relates to a method for processing a lithium tantalate crystal substrate, and more particularly to a method for processing a lithium tantalate crystal substrate with a metallic catalytic agent.

BACKGROUND

Lithium tantalate ($LiTaO_3$) (abbreviated as LT) crystal is ferroelectric crystal having a melting point of about 1650° C. and a Curie temperature of about 600° C. to 610° C. LT crystal substrates serve as materials of surface acoustic wave (SAW) filters for processing high-frequency signals of mobile phones. However, LT crystal substrates might lead to the following two problems during production of SAW filters, thereby reducing the production yield and increasing the production cost. First, since LT crystal substrates have high light transmittance, light might undesirably reflect on such substrates back to a surface thereof to be patterned during the photolithography process applied for production of SAW filters, such that the resolution of the pattern thus formed is reduced. Secondly, LT crystal, which has a high pyroelectric coefficient, might easily generate a large amount of electrostatic charges on the surface of chips due to temperature change, such that these electrostatic charges might be spontaneously released between metallic interdigital electrodes or chips and hence lead to cracking of the chips and burning of the metallic interdigital electrodes.

In order to resolve the aforesaid problems, LT crystal substrates may be subjected to a reduction treatment to reduce the volume resistivity thereof. During such reduction treatment, the LT crystal substrates change from colorless or transparently pale yellow to opaquely colored. The opaquely colored LT crystal substrates have lowered light transmittance, such that the surface thereof to be patterned may have an improved pattern resolution, and such that the electric conductivity can be enhanced to reduce the pyroelectricity for preventing cracking of chips and burning of metallic interdigital electrodes which result from generation of an electrostatic field. Since the LT crystal substrates subjected to a reduction treatment normally have a grey or black surface, such treatment is referred to as blackening.

For instance, CN 1754014 A discloses a method for processing a LT crystal substrate, which comprises bringing a first LT crystal substrate to be processed into contact with a second LT crystal substrate already reduced, and subjecting the first LT crystal substrate to a reduction treatment. However, the second LT crystal substrate must be subjected to reduction at a high temperature that is the Curie temperature of LT or higher before contacting the first LT crystal substrate to be processed (i.e. a total of two reduction treatments are required for the method of CN 1754014 A). Moreover, the first LT crystal substrate to be processed might be required to be subjected to a lapping process before being brought into contact with the second LT crystal substrate already reduced. Therefore, the method of CN 1754014 A is complicated, time-consuming, and cost-ineffective.

In addition, CN 1856597 A discloses a method for processing a LT crystal substrate, which comprises burying a LT crystal substrate in a strong reducing agent composed of a pure element (e.g. Al) or a reducing agent in the form of mixed powder composed of a pure element and a compound (e.g. Al and $Al_2O_3$), and subjecting the LT crystal substrate to a heat treatment in the presence of a flowing gas (such as $N_2$, $H_2$, Co, etc.). Since it is complicated to optimize the compositional ratio and uniformity of the mixed powder, the method of CN 1856597 A is time-consuming and cost-ineffective.

SUMMARY

Therefore, a first object of the disclosure is to provide a method for processing a lithium tantalate crystal substrate that can alleviate at least one of the drawbacks of the prior art.

The method includes:
providing a lithium tantalate crystal substrate;
roughening the lithium tantalate crystal substrate via a chemical etching treatment;
providing a catalytic agent;
bringing the lithium tantalate crystal substrate and the catalytic agent into contact with each other after the lithium tantalate crystal substrate is roughened; and
subjecting the lithium tantalate crystal substrate to a reduction treatment,
wherein the reduction treatment is conducted at a temperature not higher than a Curie temperature of the lithium tantalate crystal substrate, and
wherein the catalytic agent is selected from the group consisting of metal powder, metal gas, and metal carbonate powder.

Further, a second object of the disclosure is to provide another method for processing a lithium tantalate crystal substrate that can alleviate at least one of the drawbacks of the prior art.

The another method includes:
providing a lithium tantalate crystal substrate;
roughening the lithium tantalate crystal substrate;
providing a catalytic agent;
bringing the lithium tantalate crystal substrate and the catalytic agent into contact with each other after the lithium tantalate crystal substrate is roughened; and
subjecting the lithium tantalate crystal substrate to a reduction treatment,
wherein the reduction treatment is conducted at a temperature not higher than a Curie temperature of the lithium tantalate crystal substrate,
wherein the catalytic agent is selected from the group consisting of metal powder, metal gas, and metal carbonate powder, and
wherein the lithium tantalate crystal substrate is roughened to have a surface roughness that ranges from 0.1 µm to 10 µm.

Further, a third object of the disclosure is to provide yet another method for processing a lithium tantalate crystal substrate that can alleviate at least one of the drawbacks of the prior art.

The yet another method includes:
providing a lithium tantalate crystal substrate;
roughening the lithium tantalate crystal substrate;
providing a catalytic agent;
bringing the lithium tantalate crystal substrate and the catalytic agent into contact with each other after the lithium tantalate crystal substrate is roughened; and
subjecting the lithium tantalate crystal substrate to a reduction treatment,
wherein the reduction treatment is conducted at a temperature not higher than a Curie temperature of the lithium tantalate crystal substrate,
wherein the catalytic agent is selected from the group consisting of metal powder, metal gas, and metal carbonate powder, and
wherein the reduction treatment is conducted at a pressure ranging from 0.1 kPa to 20 kPa.

BRIEF DESCRIPTION OF THE DRAWINGS

Other features and advantages of the disclosure will become apparent in the following detailed description of the embodiment (s) with reference to the accompanying drawings, of which.

DETAILED DESCRIPTION

Figure 1:
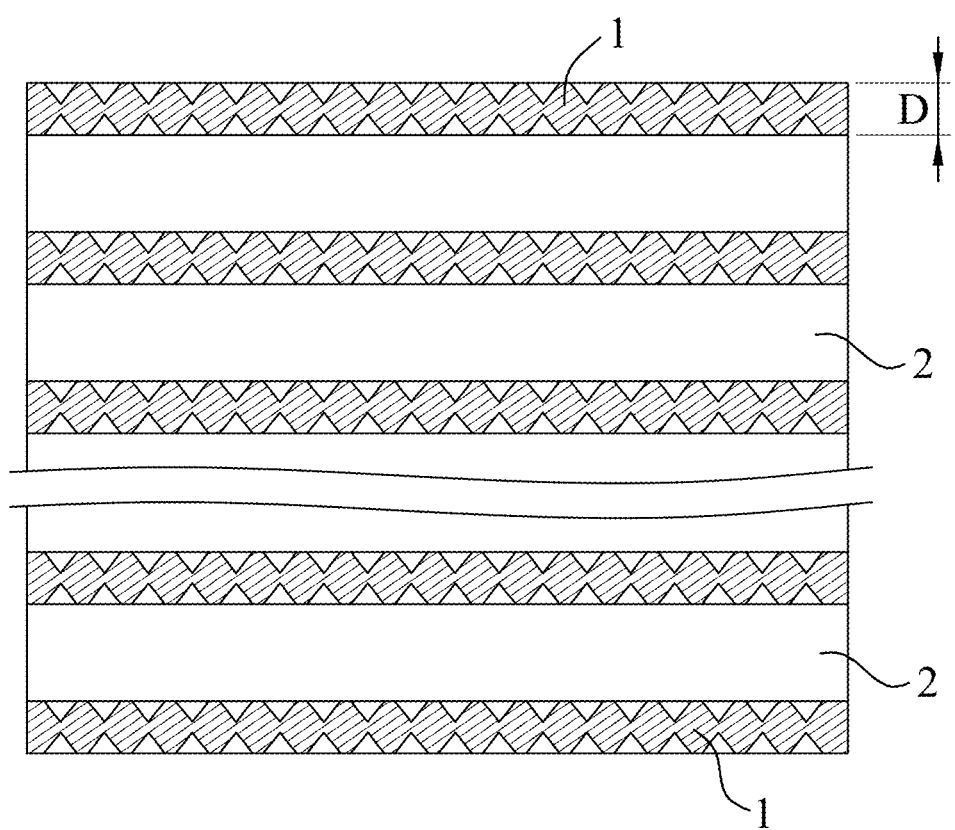
FIG. 1 is a schematic sectional view illustrating a first embodiment of a method for processing a lithium tantalate crystal substrate according to the present disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

The present disclosure provides a method for processing a lithium tantalate ($LiTaO_3$) (abbreviated as LT) crystal substrate, which includes providing a LT crystal substrate and a metallic sheet, roughening at least one of the LT crystal substrate and the metallic sheet, bringing the LT crystal substrate and the metallic sheet into contact with each other after the at least one thereof is roughened, and subjecting the LT crystal substrate to a reduction treatment. The reduction treatment is conducted at a temperature not higher than a Curie temperature of the LT crystal substrate.

In general, the term "reduction" refers to gaining electrons, and is the opposite of the term "oxidation" which refers to removing electrons. For example, removing oxygen from a material may reduce one or more components of the material. Reduction changes the optical properties of LT crystal. Without reduction, LT crystal is transparent in visible light. With increasing degree of reduction, LT crystal becomes more and more opaque and darker. That is, optical transmission decreases in the reduced LT crystal.

When the LT crystal substrate is subjected to the reduction treatment, oxidation occurs simultaneously on a reducing agent such as the metallic sheet, a gaseous reducing agent, and so forth.

The metallic sheet may have a thickness ranging from 0.05 mm to 20 mm, and may contain a metal component selected from the group consisting of aluminum (Al), titanium (Ti), zinc (Zn), iron (Fe), and combinations thereof.

The at least one of the LT crystal substrate and the metallic sheet (i.e. the LT crystal substrate alone, the metallic sheet alone, or both of the LT crystal substrate and the metallic sheet) may be roughened at a surface thereof, and may be roughened through a chemical etching treatment (for instance, a wet etching treatment). The wet etching treatment may be conducted using a solution selected from the group consisting of hydrofluoric acid, nitric acid, and a combination thereof, and may be conducted at a temperature ranging from 20° C. to 80° C. For roughening the LT crystal substrate, the wet etching treatment may be conducted for 3 to 10 hours. For roughening the metallic sheet, the wet etching treatment may be conducted for 3 to 10 minutes.

The at least one of the LT crystal substrate and the metallic sheet, when roughened at a surface thereof, may have a surface roughness (Ra) ranging from 0.1 μm to 10 μm. In some embodiments, the at least one of the LT crystal substrate and the metallic sheet is roughened to have a surface roughness that is larger than 3 μm and not greater than 10 μm. In other embodiments, the at least one of the LT crystal substrate and the metallic sheet is roughened to have a surface roughness that ranges from 0.1 μm to 3 μm.

The reduction treatment may be conducted in the presence of a gas selected from the group consisting of a hydrogen gas, a carbon monoxide gas, a nitrous oxide gas, a nitrogen gas, an argon gas, and combinations thereof. The gas may be allowed to flow during the reduction treatment, and may have a flow rate ranging from 0.3 to 5.0 liters per minute.

The temperature for conducting the reduction treatment may range from 350° C. to 610° C. The reduction treatment may be conducted for 3 to 12 hours. The reduction treatment may be conducted in a furnace, and may be conducted at a pressure ranging from 3.0 kPa to 20 kPa.

First, second, and third embodiments of the method according to the present disclosure are illustrated below.

Referring to FIG. 1, in the first embodiment of the method, a plurality of the metallic sheets 1 and a plurality of the LT crystal substrates 2 are provided. The metallic sheets 1 may have the thickness (D) described above, and may contain Al in this embodiment. Each of the metallic sheets 1 is roughened at two opposite surfaces thereof through the wet etching treatment described above, thereby having the Ra described above. In a quartz chamber, the roughened metallic sheets 1 and the LT crystal substrates 2 are brought into contact with one another, to be specific, are alternately stacked on one another. The roughened metallic sheets 1 and the LT crystal substrates 2 are subjected to the reduction treatment described above in a furnace. The temperature for conducting the reduction treatment ranges from 350° C. to 600° C. in this embodiment.

Figure 2:
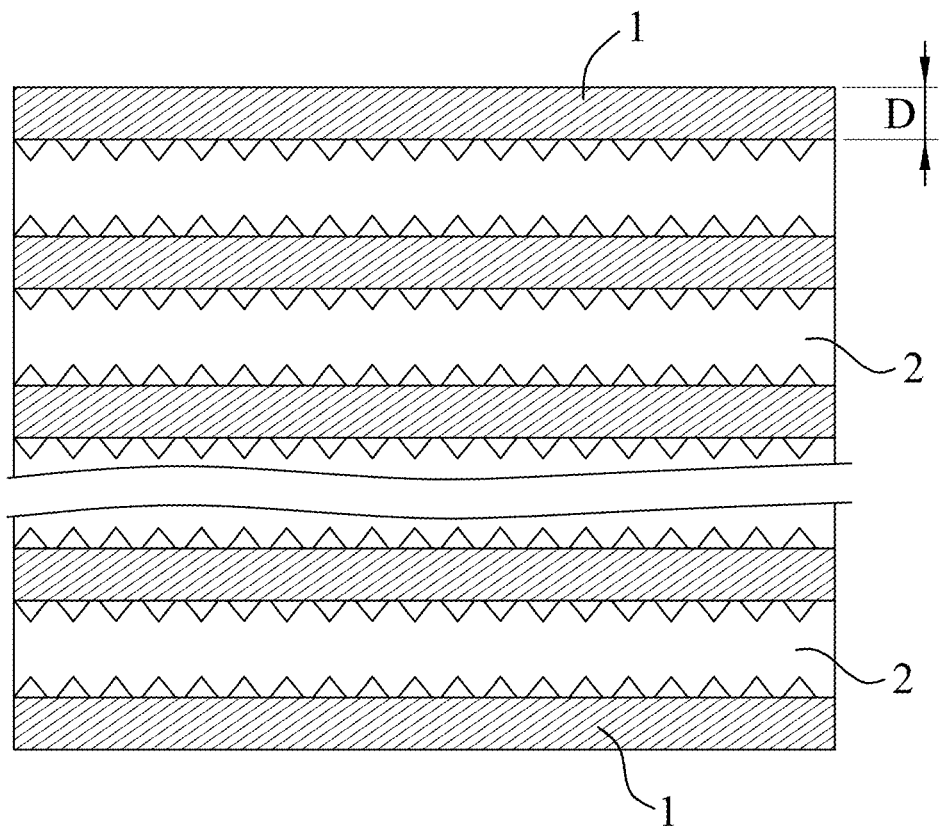
FIG. 2 is a schematic sectional view illustrating a second embodiment of the method according to the present disclosure.

Referring to FIG. 2, the second embodiment of the method is similar to the first embodiment of the method, except that each of the LT crystal substrates 2, rather than each of the metallic sheets 1, is roughened at two opposite surfaces thereof through the wet etching treatment described above and hence has the Ra described above.

Figure 3:
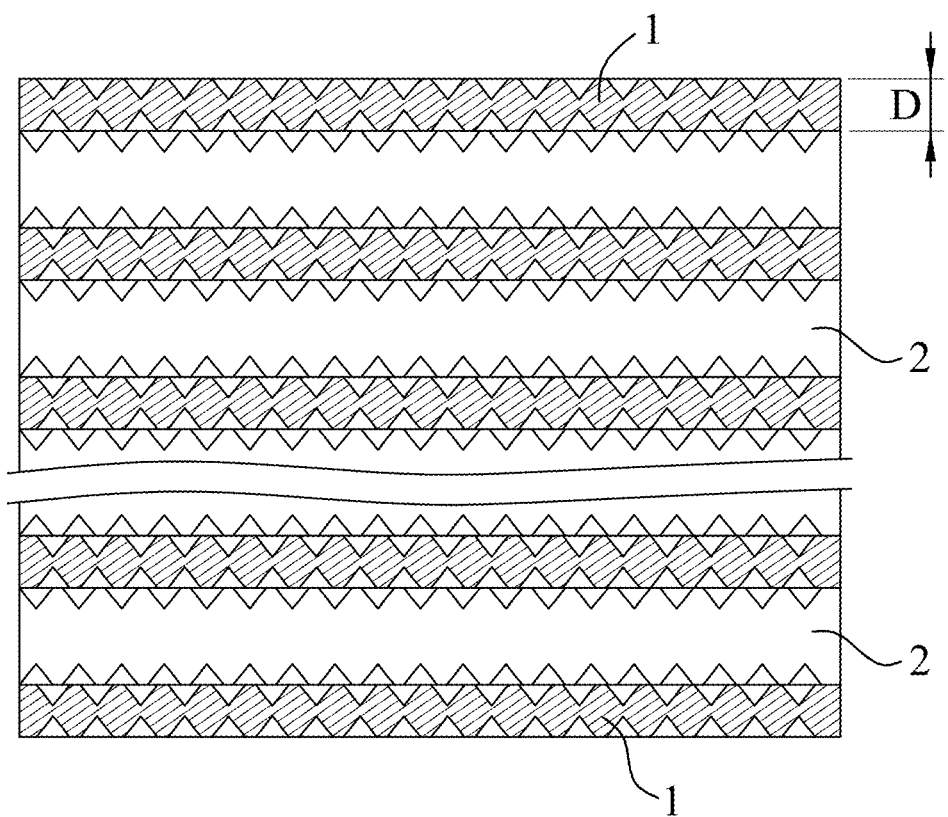
FIG. 3 is a schematic sectional view illustrating a third embodiment of the method according to the present disclosure.

Referring to FIG. 3, the third embodiment of the method is similar to the first embodiment of the method, except that each of the metallic sheets 1 and the LT crystal substrates 2 is roughened at two opposite surfaces thereof through the wet etching treatment described above and hence has the Ra described above.

The advantages of the method of the present disclosure are described below.

In case that a LT crystal substrate and a metallic sheet are brought into contact with each other (e.g. by stacking) but both are not roughened, such LT crystal substrate and such metallic sheet not roughened have an unsatisfactorily low Ra (i.e. a high surface flatness) and hence have no space therebetween upon contact. Therefore, a flowing gas intended to reduce the LT crystal substrate can hardly get access to the surface of the LT crystal substrate, thus decreasing the reduction rate of the LT crystal substrate. In contrast to the case mentioned above, in the method of the present disclosure (taking the first and third embodiments above as examples), a roughened metallic sheet and a LT crystal substrate may be stacked on each other, so that a flowing gas for reducing the LT crystal substrate can get access to the surface of the LT crystal substrate and hence enhance the reduction rate.

In addition, since an unroughened metallic sheet as described above might form an oxidation layer on a surface thereof to be brought into contact, such oxidation layer might prohibit a LT crystal substrate from being reduced. Nevertheless, the method of the present disclosure (taking the first and third embodiments above as examples), which may include a step of roughening a metallic sheet to remove an oxidation layer thereof and to achieve a satisfactory Ra, can allow a LT crystal substrate to be reduced by virtue of the metallic sheet and/or a flowing gas.

Normally, a LT crystal substrate to be reduced might have been subjected to polishing, thereby having a more unsatisfactorily low Ra (i.e. a higher surface flatness). Thus, there might be no space between such LT crystal substrate and a metallic sheet in contact therewith (e.g. stacked thereon). In order for a flowing gas serving as a reducing agent to get access to the surface of the LT crystal substrate and to hence enhance the reduction rate, in the method of the present disclosure (taking the second and third embodiments above as examples), a LT crystal substrate may be roughened first to increase the Ra thereof and then stacked onto a metallic sheet. Alternatively, a metallic sheet might have been subjected to polishing, thereby having a more unsatisfactorily low Ra. Likewise, the metallic sheet may be roughened first to increase the Ra thereof and then stacked onto a LT crystal substrate (taking the first and third embodiments above as examples). Or even alternatively, both a LT crystal substrate to be reduced and a metallic sheet might have been subjected to polishing, thereby having a more unsatisfactorily low Ra. Likewise, both the LT crystal substrate and the metallic sheet may be roughened first to increase the Ra thereof and then stacked onto each other (taking the third embodiment above as an example).

Besides, since a LT crystal substrate which has been subjected to polishing as described above might have a damaged layer on a surface thereof to be brought into contact, such damaged layer might prohibit the LT crystal substrate from being reduced. Nevertheless, the method of the present disclosure (taking the second and third embodiments above as examples), which may include a step of roughening a polished LT crystal substrate to remove a damaged layer thereof and to achieve a satisfactory Ra, can allow the LT crystal substrate to be reduced by virtue of a metallic sheet and/or a flowing gas. Likewise, a metallic sheet which has been subjected to polishing as described above might have a damaged layer on a surface thereof to be brought into contact, and such damaged layer hence might prohibit the LT crystal substrate from being reduced. The method of the present disclosure (taking the first and third embodiments above as examples), which may include a step of roughening a polished metallic sheet to remove a damaged layer thereof and to achieve a satisfactory Ra, can allow the LT crystal substrate to be effectively reduced.

By virtue of the method of the present disclosure, a 4-inch LT crystal substrate for surface acoustic wave filters, which has volume resistivity of $1\times10^{10}$ to $1\times10^{12}$ $\Omega$cm, may be obtained. Furthermore, a LT crystal substrate obtained through the method of the present disclosure may have satisfactory resistivity and light transmittance, and may still possess characteristics of piezoelectric LT materials.

Lastly, the metallic sheet employed in the method of the present disclosure for processing the LT crystal substrate is cost-effective, rendering the method of the present disclosure satisfactory in terms of the cost.

Besides the method described above, the present disclosure provides an alternative method for processing a LT crystal substrate, which includes providing a LT crystal substrate, roughening the LT crystal substrate via a chemical etching treatment as described above, providing a catalytic agent, bringing the LT crystal substrate and the catalytic agent into contact with each other after the LT crystal substrate is roughened, and subjecting the LT crystal substrate to a reduction treatment as described above. The reduction treatment is conducted at a temperature not higher than a Curie temperature of the LT crystal substrate. The catalytic agent is selected from the group consisting of metal powder, metal gas, and metal carbonate powder.

The catalytic agent may include a metal material selected from the group consisting of aluminum, copper, zinc, iron, lithium, and combinations thereof.

In the alternative method, the temperature for conducting the reduction treatment may range from 350° C. to 600° C., the reduction treatment may be conducted for 1 to 10 hours, the reduction treatment may be conducted at a pressure ranging from 0.1 kPa to 20 kPa, and the reduction treatment may be conducted in the presence of a gas selected from the group consisting of a hydrogen gas, a carbon monoxide gas, a nitrogen gas, and combinations thereof.

Two embodiments of the alternative method according to the present disclosure are illustrated below.

Figure 4:
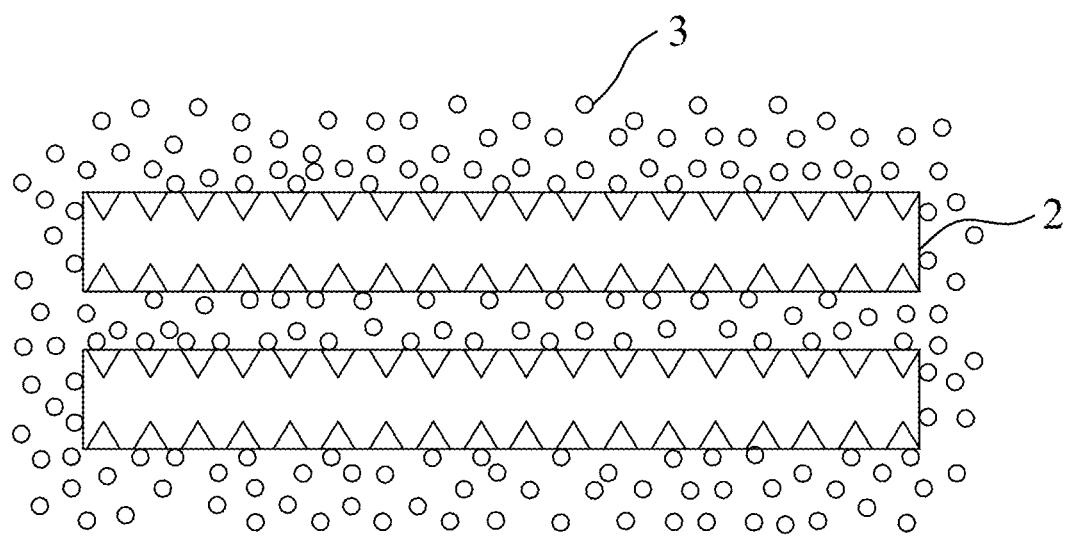
FIG. 4 is a schematic view illustrating an embodiment of an alternative method according to the present disclosure.

Referring to FIG. 4, in an embodiment of the alternative method, a plurality of the LT crystal substrates 2 (two shown in the drawing) are provided.

The LT crystal substrates 2 are subjected to lapping to have a reduced thickness. Subsequently, the LT crystal substrates 2 are roughened via the wet etching treatment described above, so as to remove a damaged layer of the LT crystal substrates 2 arising from lapping and so as to achieve a satisfactory Ra. The catalytic agent 3, which is zinc powder, is provided. In a quartz chamber, the LT crystal substrates 2 are disposed to be spaced apart from one another, and the catalytic agent 3 is disposed to sufficiently encapsulate the LT crystal substrates 2 and to fill the space therebetween (it should be noted that only some portions of the catalytic agent 3 are shown to contact the LT crystal substrates 2 in FIG. 4 for the sake of clarity). In the presence of the catalytic agent 3, the LT crystal substrates 2 are subjected to the reduction treatment described above in a furnace. The temperature for conducting the reduction treatment ranges from 350° C. to 550° C. The reduction treatment is conducted in the presence of a gas selected from the group consisting of a hydrogen gas, a nitrogen gas, and a combination thereof. The flow of the gas may be as described above. The reduction treatment is conducted for 3 to 10 hours. After the reduction treatment, the LT crystal substrates 2 undergoing blackening are allowed to cool down.

Another embodiment of the alternative method is generally similar to the aforesaid embodiment of the alternative method, except for the following differences. The catalytic agent 3 is $Li_2CO_3$ powder. Moreover, the temperature for conducting the reduction treatment ranges from 350° C. to 600° C. In addition, carbon monoxide (CO) is generated during heating of the catalytic agent 3, and CO removes oxygen from the LT crystal substrates 2 to generate carbon dioxide ($CO_2$), which is in turn discharged.

The advantages of the alternative method include, in addition to some of the advantages already described above, the following.

First, since the catalytic agent 3 can be used to sufficiently encapsulate the LT crystal substrate(s) 2, the reduction of the LT crystal substrate(s) 2 can be more effectively conducted. For instance, all the surfaces of the LT crystal substrate(s) 2 can undergo reduction.

Secondly, when the catalytic agent 3 is powder (metal powder or metal carbonate powder), the intended degree of the reduction of the LT crystal substrate(s) 2 can be adjusted by controlling the particle size of the powder, so as to enhance the process window. Additionally, since higher porosity can be achieved by virtue of the catalytic agent 3 in powder form, the gas for the reduction treatment can more easily enter the void spaces and participate in the reduction treatment, lowering the required temperature for the reduction treatment and hence preventing shortcomings (such as unsatisfactory physical appearance) resulting from an overly high temperature.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A method for processing a lithium tantalate crystal substrate, comprising:
    providing a lithium tantalate crystal substrate;
    roughening the lithium tantalate crystal substrate via a chemical etching treatment;
    providing a catalytic agent;
    bringing the lithium tantalate crystal substrate and the catalytic agent into contact with each other after the lithium tantalate crystal substrate is roughened; and
    subjecting the lithium tantalate crystal substrate to a reduction treatment,
    wherein the reduction treatment is conducted at a temperature not higher than a Curie temperature of the lithium tantalate crystal substrate, and
    wherein the catalytic agent is selected from the group consisting of metal powder, metal gas, and metal carbonate powder.

2. The method as claimed in claim 1, wherein the lithium tantalate crystal substrate is subjected to lapping to have a reduced thickness before the lithium tantalate crystal substrate is roughened.

3. The method as claimed in claim 1, wherein the lithium tantalate crystal substrate is roughened to have a surface roughness that ranges from 0.1 μm to 10 μm.

4. The method as claimed in claim 3, wherein the lithium tantalate crystal substrate is roughened to have a surface roughness that ranges from 0.1 μm to 3 μm.

5. The method as claimed in claim 1, wherein the catalytic agent includes a metal material selected from the group consisting of aluminum, copper, zinc, iron, lithium, and combinations thereof.

6. The method as claimed in claim 1, wherein the chemical etching treatment is a wet etching treatment.

7. The method as claimed in claim 1, wherein the reduction treatment is conducted in the presence of a gas selected from the group consisting of a hydrogen gas, a carbon monoxide gas, a nitrogen gas, and combinations thereof.

8. The method as claimed in claim 7, wherein the gas has a flow rate ranging from 0.3 to 5.0 liters per minute.

9. The method as claimed in claim 1, wherein the temperature for conducting the reduction treatment ranges from 350° C. to 600° C.

10. The method as claimed in claim 9, wherein the reduction treatment is conducted for 1 to 10 hours.

11. The method as claimed in claim 1, wherein the reduction treatment is conducted at a pressure ranging from 0.1 kPa to 20 kPa.

12. A method for processing a lithium tantalate crystal substrate, comprising:
    providing a lithium tantalate crystal substrate;
    roughening the lithium tantalate crystal substrate;
    providing a catalytic agent;
    bringing the lithium tantalate crystal substrate and the catalytic agent into contact with each other after the lithium tantalate crystal substrate is roughened; and
    subjecting the lithium tantalate crystal substrate to a reduction treatment,
    wherein the reduction treatment is conducted at a temperature not higher than a Curie temperature of the lithium tantalate crystal substrate,
    wherein the catalytic agent is selected from the group consisting of metal powder, metal gas, and metal carbonate powder, and
    wherein the lithium tantalate crystal substrate is roughened to have a surface roughness that ranges from 0.1 μm to 10 μm.

13. The method as claimed in claim 12, wherein the reduction treatment is conducted at a pressure ranging from 0.1 kPa to 20 kPa.

14. The method as claimed in claim 12, wherein the catalytic agent includes a metal material selected from the group consisting of aluminum, copper, zinc, iron, lithium, and combinations thereof.

15. The method as claimed in claim 12, wherein the lithium tantalate crystal substrate is roughened to have a surface roughness that ranges from 0.1 μm to 3 μm.

16. A method for processing a lithium tantalate crystal substrate, comprising:
   providing a lithium tantalate crystal substrate;
   roughening the lithium tantalate crystal substrate;
   providing a catalytic agent;
   bringing the lithium tantalate crystal substrate and the catalytic agent into contact with each other after the lithium tantalate crystal substrate is roughened; and
   subjecting the lithium tantalate crystal substrate to a reduction treatment,
   wherein the reduction treatment is conducted at a temperature not higher than a Curie temperature of the lithium tantalate crystal substrate,
   wherein the catalytic agent is selected from the group consisting of metal powder, metal gas, and metal carbonate powder, and
   wherein the reduction treatment is conducted at a pressure ranging from 0.1 kPa to 20 kPa.

17. The method as claimed in claim 16, wherein the catalytic agent includes a metal material selected from the group consisting of aluminum, copper, zinc, iron, lithium, and combinations thereof.

* * * * *